United States Patent [19]

Zorina et al.

[11] Patent Number: 5,474,642

[45] Date of Patent: Dec. 12, 1995

[54] APPARATUS FOR THE TREATMENT OF A SOLID BODY

[75] Inventors: Eugene Zorina; Vladimir Ivanov; Pavel Kulik; Alexis Logoshin, all of Moscow, Russian Federation; Alim Tchabanov, Urkrainia, Ukraine; George Pavlov; Vecleslav Shvetchov, both of Moscow, Russian Federation

[73] Assignee: Overseas Publishers Association, Amsterdam, Netherlands

[21] Appl. No.: 150,112

[22] PCT Filed: May 19, 1992

[86] PCT No.: PCT/EP92/01131

§ 371 Date: Feb. 1, 1994

§ 102(e) Date: Feb. 1, 1994

[87] PCT Pub. No.: WO92/21220

PCT Pub. Date: Nov. 26, 1992

[30] Foreign Application Priority Data

May 24, 1991 [RU] Russian Federation .......... 4935913/25

[51] Int. Cl.[6] ..................................................... H05H 1/00
[52] U.S. Cl. ............... 156/345; 204/298.32; 204/298.36; 204/298.37; 118/723 ER; 118/723 IR; 216/60; 216/67
[58] Field of Search .................................. 156/345, 643; 204/298.32, 298.38, 298.37, 298.36; 118/50.1, 723 ME, 723 MR, 723 ER, 723 IR; 219/121.4, 121.41, 121.44, 121.5, 121.52

[56] References Cited

U.S. PATENT DOCUMENTS

| 3,278,796 | 10/1966 | Takei et al. | 315/111.41 |
|---|---|---|---|
| 4,021,675 | 5/1977 | Shifrin | 250/492.2 |
| 4,462,862 | 7/1984 | Nishimatsu et al. | 156/643 |
| 4,487,162 | 12/1984 | Cann | 118/50.1 X |
| 4,609,810 | 9/1986 | O'Brien et al. | 219/121.54 |
| 4,946,537 | 8/1990 | Hijikata et al. | 156/345 |
| 5,000,771 | 3/1991 | Fleming, Jr. et al. | 156/643 X |
| 5,053,678 | 10/1991 | Koike et al. | 315/111.81 |
| 5,062,364 | 11/1991 | Lewis et al. | 101/467 |
| 5,091,049 | 2/1992 | Campbell et al. | 156/643 |
| 5,120,703 | 6/1992 | Snyder et al. | 427/226 X |
| 5,290,382 | 3/1994 | Zarowin et al. | 156/345 |
| 5,304,407 | 4/1994 | Hayashi et al. | 427/569 |
| 5,336,355 | 8/1994 | Zarowin et al. | 156/345 |

FOREIGN PATENT DOCUMENTS 3623441  1/1987  Germany.

*Primary Examiner*—Thi Dang
*Attorney, Agent, or Firm*—Lowe, Price, LeBlanc & Becker

[57] ABSTRACT

Plasma treatment apparatus includes means to generate a plasma jet at atmospheric pressure, and means to control both the cross-sectional size of the jet and the relative speed of movement between the jet and a body being treated.

15 Claims, 5 Drawing Sheets

2

APPARATUS FOR THE TREATMENT OF A SOLID BODY

FIELD OF THE INVENTION

This invention relates to the treatment of solid bodies and, more specifically, it deals with an apparatus for the plasma treatment of the surface of a solid body. The invention may be used, e.g. in electrical engineering, mechanical engineering, electronics and other fields.

BACKGROUND ART

Plasma technology for the treatment of solid bodies is now under intensive development to replace substantially liquid chemical kinds of treatment in all operations. Various kinds of processing of the surface of solid bodies exist, including heat treatment, plasmochemical cleaning and etching, and film forming.

Known in the art are plants in which a plasma medium is provided under a pressure of at least $10^2$ Pa. Such vacuum plasma treatment plants include a vacuum chamber having a gas evacuation system and incorporating a plasma generator having a plasma forming gas supply system and a support holder. A three-dimensional charge is excited in such vacuum plasma treatment plants, and the support is stationary. For the excitation of plasma, use is made of a high-frequency, SHF Super High Frequency, glow, or arc discharge which, according to the gas or cathode target material used, forms a desired plasma composition for etching or film deposition.

Higher vacuum under these conditions contributes to a more uniform surface treatment. However, a higher vacuum results in a decrease in the density of active particles and the lower flow of such particles towards the surface, so as to prolong the surface treatment period. This is one of the reasons why the throughput capacity of such plants is inadequate. In addition, low throughput capacity is caused by the need for the continuous maintenance of the vacuum, i.e. evacuation of the whole working volume of the chamber. This is especially pronounced where the plasma forming gas is to be replaced, when it is necessary to carry out the complete cleaning of particles from the chamber, so as to avoid having undesired impurities when starting a new cycle of surface treatment. This results in the need for a prolonged period of preparation of the plant for operation. When such plants are used for continuous manufacturing treatment processes, lock chambers are provided where there is a need for communication with atmosphere, so as to increase the throughput capacity. In such arrangements, contamination of the supports can result, which is extremely undesirable, particularly in electronic engineering.

SUMMARY OF THE INVENTION

These disadvantages are reduced in a plasma reactor described in U.S. Pat. No. 4,946,537 with a vacuum chamber which has a reagent gas supply system, a plasma generator, and at least one elctromagnetic coil which is positioned coaxially with the chamber. A specimen is mounted in a holder inside the chamber to extend in parallel with a magnetic field generated by the coil. A high-energy flow of charged high-density particles from the plasma is incident perpendicularly upon the surface of the specimen so as to carry out the treatment.

High-energy ions interacting with the surface give rise to radiation-induced defects, i.e., to disruptions of structure and atomization of the material being treated and initiate radiation-induced chemical reactions. As the degree of integration of chips grows higher, process layers in the active structures become thinner and thinner. Radition induced effects in such layers cause changes in electrical properties and can even result in complete rejection of elements of chips. Such a reactor cannot ensure the necessary high quality of treatment.

It is an object of the invention to increase throughput capacity and enhance the quality of treatment of solid bodies.

In one embodiment of the invention to be described an apparatus for plasma treatment, preferably with planar supports, comprises a plasma generator having a plasma forming gas supply system and a power supply, and a support holder, the plasma generator including a generator of a plasma jet under atmospheric pressure having a regulator of the cross-sectional size of the plasma jet. The support holder and the plasma jet generator are mounted for movement with respect to each other in the direction of at least one coordinate axis for regularly introducing the support holder into, and retracting it from the treatment zone. The apparatus of this embodiment is also provided with a means for setting the support holder speed and the cross-sectional size of the plasma jet, being connected to the regulator of the cross-sectional size of the plasma jet and with a drive for the support holder. The drive for the support holder is capable of varying the support holder speed both within and outside the treatment zone.

One advantage of the apparatus to be described resides in its high throughput capacity, the use in the apparatus of a plasma jet-generator for the atmospheric pressure jet allowing the processes of interaction of the plasma with the surface outside the vacuum chamber to be intensified. No vacuum equipment for evacuation and no sealed chamber are required so that the apparatus is always ready for operation. Unlike arrangements employing reduced-pressure plasma, the use of a plasma generator for an atmospheric pressure plasma jet enables the transfer of active particles (excited ions and atoms) towards the support surface to occur through diffusion rather than through free molecular movement. The density of the active particle flow in this case is very many times higher than that obtainable in vacuum plants. The active particles diffuse towards the surface under these conditions without any loss of activity as the flight distance for non-elastic interactions is much greater than the thickness of the boundary layer (the boundary layer is formed adjacent to the support surface when plasma jet flows around it, and its thickness is about 10-4 m (with $q \approx 10^7$ W/m$^2$). However, as a result of elastic collisions in the boundary layer, the active particles lose their kinetic energy. Therefore, with a very high density of active particle flow, hence, with a high raze of photochemical processes occurring on the surface, i.e., with a high speed of surface treatment, any radiation-induced damage is substantially excluded and a high quality of treatment can be achieved. As the thermal flux directed towards the surface is high (plasma temperature is as high as $((10 \text{ to } 15) \cdot 10^3 \text{K})$, this plasma can be used for treatment in an unsteady heat conductance mode, i.e., with a short term plasma action upon the surface (the residence time of a point under treatment in a plasma stream is about 10 ms). This surface treament is a dynamic plasma operation (DPO). For carrying out this process, an apparatus must have systems for setting up the jet size and the support speed and also devices for carrying out a precision control of the relative movement of the plasma jet generator and the support.

For maintaining the desired size of the plasma jet during treatment, a means for setting the cross-sectional size of the plasma jet includes a brightness detector in the particular embodiment. The brightness detector carries out monitoring and, following the receipt of an error signal, a command for correcting the size of the plasma jet is sent from the detector to the setting means.

In carrying out the treatment of a large number of identical parts, it is preferred that the support holder be in the form of a turret, so as to raise substantially the throughput capacity of the apparatus.

To provide for the possibility of the deposition of films of organometal compounds and for carrying out etching, the plasma forming gas supply system has in certain embodiments to be provided with a vaporizer having a thermocontrolled conduit for maintaining the organometal compounds in the gaseous state. The free end of the thermocontrolled conduit is directed towards the plasma jet zone. This increases the manufacturing capabilities of the apparatus, owing to a broadening of the range of types of film that can be deposited.

To reduce the consumption of a plasma forming gas, the gas supply system may be provided with a controlled valve and the support holder may be provided with a coordinate pickup, the signal of the pickup controlling the valve so that the valve might be opened only at the moment the support passes through the treatment zone.

To increase the output of the process in treating parts having a diameter which is greater than the plasma jet size, the support may be rotated about an axis drawn through its geometrical centre perpendicularly with respect to the support plane. This allows the whole support to be treated in a single pass.

The above and still further objects, features and advantages of the present invention will become apparent upon consideration of the following detailed description of a specific embodiment thereof, especially when taken in conjunction with the accompanying drawings.

DESCRIPTION OF THE PREFERRED EMBODIMENT

Figure 1:
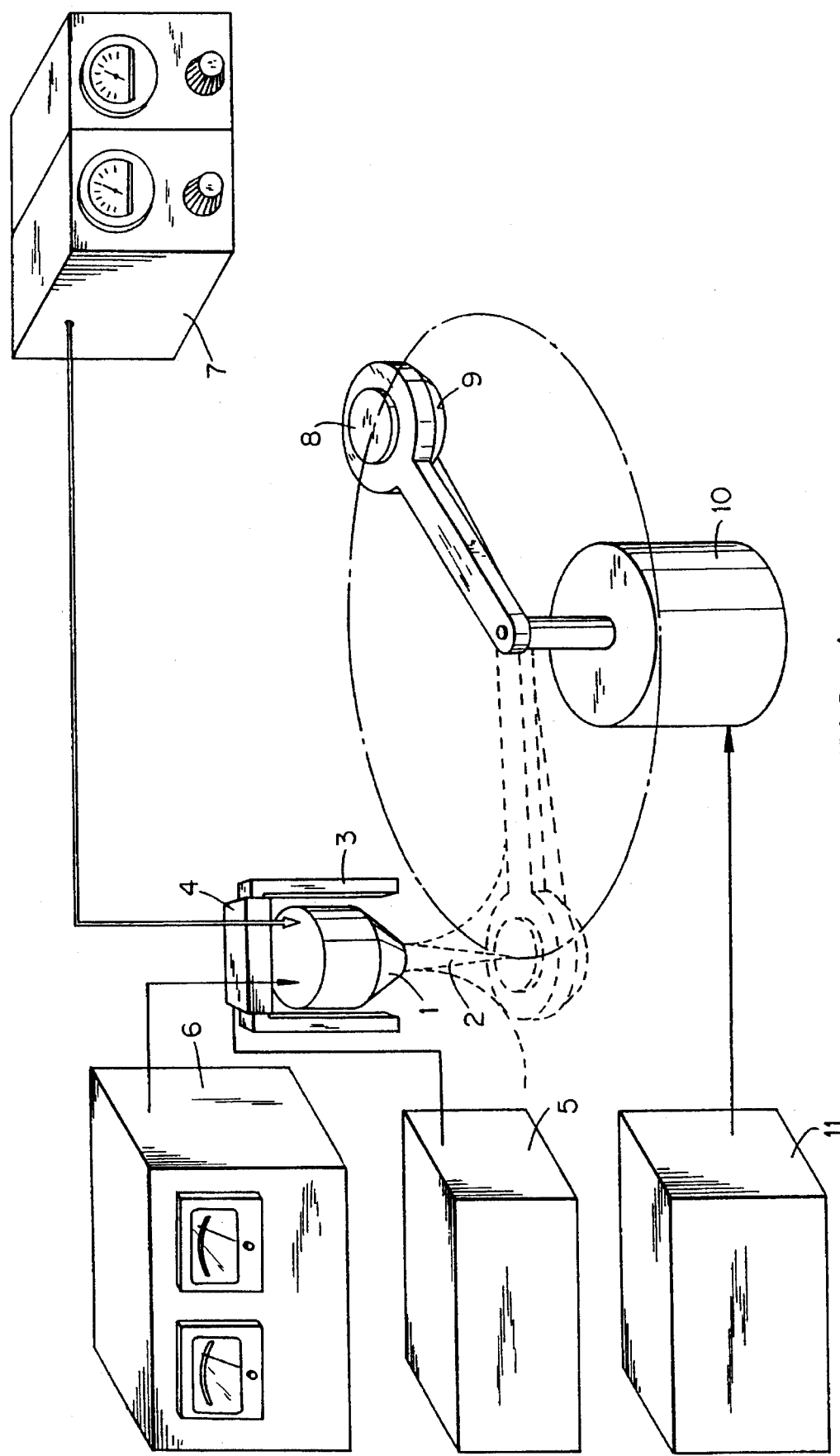
FIG. 1 is a perspective schematic illustration of one arrangement.

Referring to FIG. 1 there is shown a most ingenuous embodiment of one form of apparatus.

In this embodiment, a generator 1 for a plasma jet 2 is provided with a regulator of the cross-sectional size of the plasma jet 2, which may be in the form of an open-ended magnetic circuit 3 mounted coaxially with the generator 1 and connected to a solenoid 4 which receives a control signal from a means 5 for setting the cross-sectional size of the plasma jet 2. The generator 1 is connected to a power supply 6, and a plasma forming gas is supplied to the generator 1 from the system 7. A support 8 is attached, e.g., by means of a vacuum suction device, to a holder 9 which has a drive 10 controlled by a setting means 11 for setting-up the speed of movement of the support 8. The holder 9 for the support 8 performs a rotary motion. The generator 1 of the plasma jet 2 is mounted above a plane defined by the path of movement of the holder 9, in such a manner that plasma jet intersects this path to define a support treatment zone. The setting means 5 may be in the form of a current generator, e.g., a transistor having its base arranged to receive a drive signal in the form of a voltage from a variable resistor. The coil of the solenoid 4 is arranged in the emitter circuit of the transistor.

In the simplest case, the setting means 11 may be in the form of a controlled pulse generator with a pulse rate determining the speed of movement of the holder 9 of the support 8. It is arranged that a change in the frequency of the controlled pulse generator corresponds to a change in speed of the support 8.

The operation of the apparatus will now be described with reference to a specific example which involves the removal of a photo resistor mask from the surface of a silicon chip support.

Unlike previously proposed arrangements, the apparatus of the arrangement to be described allows the removal to be carried with an inert gas plasma, thereby ruling out undesired chemical effects upon the structures formed as a result of a high-density flow of active particles towards the surface being treated.

Direct current of 100 A is supplied to the generator 1 from the power supply 6, and nitrogen as a plasma forming gas is supplied through the gas supply system 7. A signal from the setting means 5 determines the value of the current at the solenoid 4 to define the magnitude of the magnetic field induced by the magnetic circuit 3. The magnetic field of the open-ended magnetic circuit 2 causes the cross-sectional size of the plasma jet to be between 6 and 2 cm. These parameters ensure the necessary power density of the plasma jet 2 for removing a photo resistive mask from the support 8. The setting means 11 sets up the speed of movement of the support 8 in the treatment zone at 0.8 m/s. During the treatment, the support 8 is heated to 300° C. For the complete removal of the photo resistive mask from the support 8, the treatment has to be repeated several times. The support 8 is preferably cooled down to a predetermined starting temperature before each successive treatment cycle. This step takes from 5 to 10 seconds. These conditions are taken into account in setting up the speed of movement of the support 8 outside the treatment zone.

It is preferable that, during successive treatment cycles, the plasma parameters should remain unchanged, so that monitoring is required in order to ensure that the conditions do not change. Monitoring of the conditions can be achieved by means of a brightness detector. The same reference numerals are used for similar parts of the apparatus in the different figures of the drawings.

Figure 2:
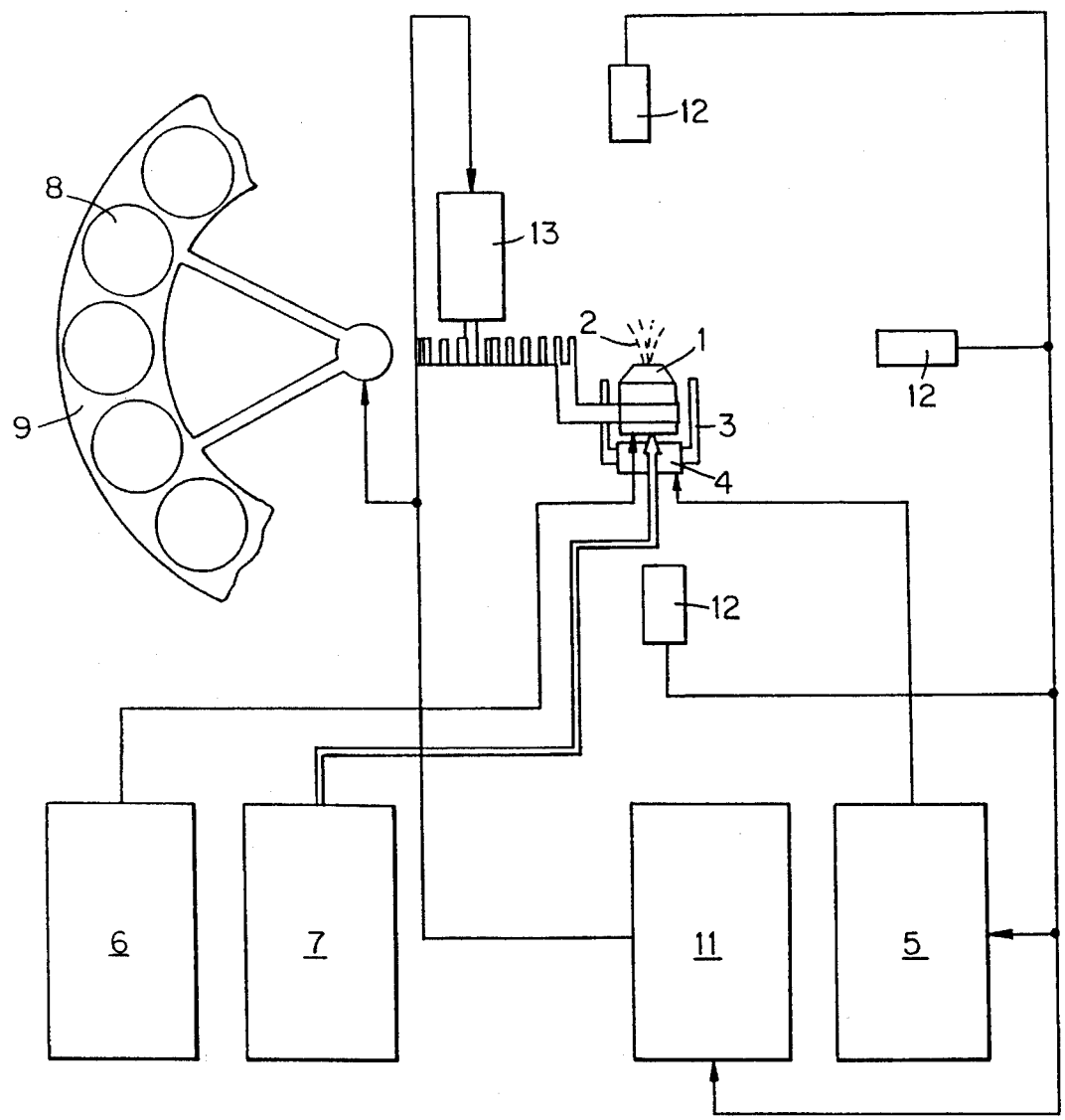
FIG. 2 is a diagrammatic and partly block schematic illustration of an apparatus having a brightness detector.

FIG. 2 shows an apparatus in which three brightness detectors 12 are provided for monitoring the cross-sectional size of the plasma jet 2. The brightness detectors 12 are positioned in a plane drawn in parallel with the plane of movement of the support 8. The brightness detectors 12 keep a watch on the brightness distribution in the plasma jet 2 continually, and error signals are fed from it to them setting means 5 and 11 in order to allow the cross-sectional size of the plasma jet 2 and the speed of movement of the support 8, respectively, to be controlled. This control results in a high consistency in the reproducibility of the treatment results. This feature is especially important if a turret is used as a support holder 9 in order to increase substantially the throughput capacity of the apparatus in carrying out a continuous treatment process using a large number of supports 8. In this case the generator 1 has a drive 13 controlled by the setting means 11. The drive 13 moves the generator 1 in the transverse direction with respect to the path of movement of the support 8. This movement of the generator 1 allows a more uniform treatment of the support to be given, since the distribution of the energy density of the plasma jet 2 is not uniform and is at its maximum at the centre of the jet 2. The movement of the generator 1 corresponds to the movement of the plasma jet 2 along the surface of the support 8 being treated. For this reason, the centre of the plasma jet 2 will pass over the entire surface area of the support 8 during several consecutive treatment cycles.

Figure 3:
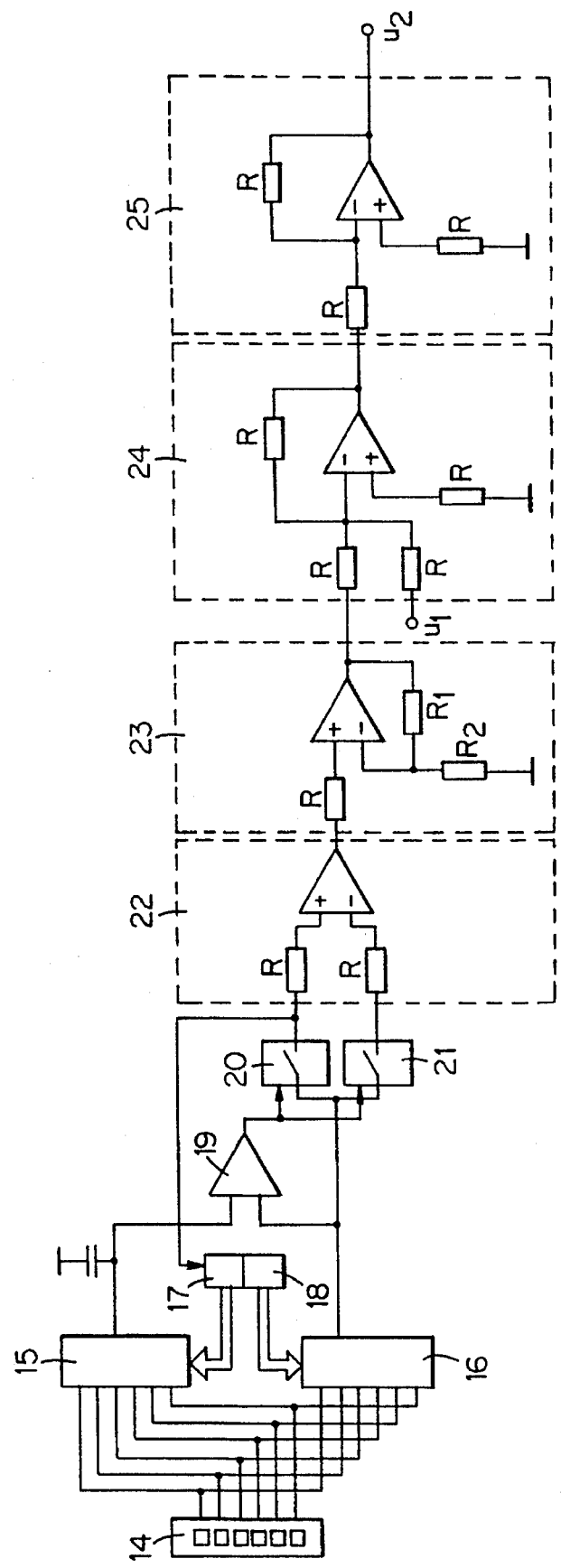
FIG. 3 is a block circuit diagram of a brightness detector.

The brightness detectors 12 used in the apparatus may be configured as shown in FIG. 3. A brightness detector 12 consists of a line 14 of SCC-receivers, first and second analog switching circuits 15 and 16 controlled by first and second counters 17 and 18, a comparator 19, first and second analog switches 20 and 21, an adder 22 an inverting adder 24, and an inverter 25.

This system is designed for monitoring the brightness and temperature distribution in the plasma jet 2 for evaluating changes in the plasma parameters.

The system functions in the following manner.

Signals from the outputs of the receivers of the line 14 arrive at the inputs of the analog switching circuits 17 and 18, respectively. The counters 17 and 18 function in such a manner that signals from all of the receivers of the line 14 appear one-by-one at the output of the analog switching circuit 15. Signals from the rest of the receivers of the line 14 appear one-by-one at the output of the switching circuit 16 during the period within which a signal from the first receiver of the line 14 appears at the output of the switching circuit 15.

The outputs of the switching circuits 15 and 16 are connected to the inputs of the comparator 19, which has its output connected to control the inputs of the analog switches 20 and 21. A signal from the output of switching circuit 16 goes to the signal inputs of the analog switching circuits 20 and 21. The comparator 19 consecutively compares the signal from the first receiver of the line 14 with the signals from the rest of the receivers of the line 14. The comparison results arrive at the control inputs of the analog switches 20 and 21, which are made conductive once in order to let a signal through when there are no control signals from the output of the comparator 19, the switch 20 being made conductive when a maximum-value signal from the line 14 is detected. The switch 21 is made conductive upon the detection of a second-value signal from the line 14.

Figure 4:
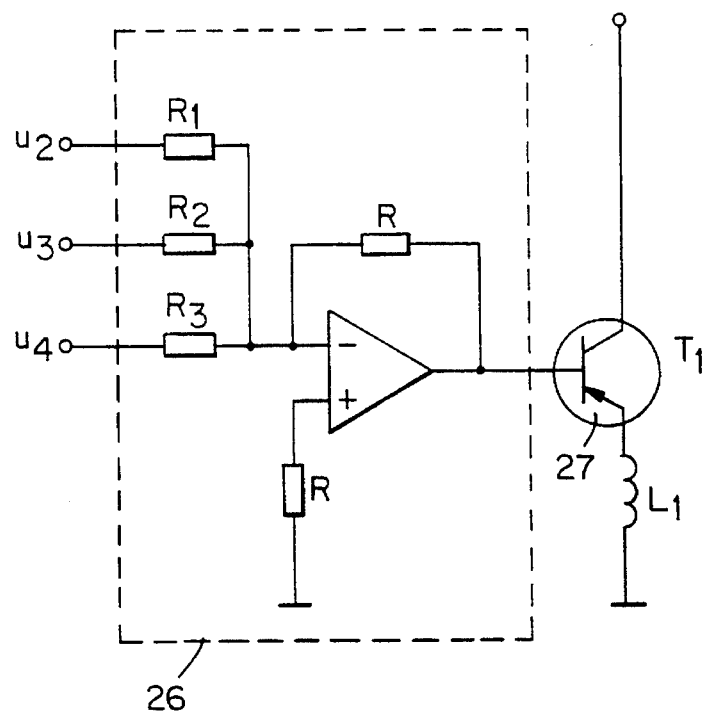
FIG. 4 is a circuit diagram of means for setting the cross-sectional size of a plasma jet.

A signal, which is responsive to the maximum-value on the line 14, and which is obtained from the output of the switch 20 arrives at the adding input of the adder 22 and at the control input of the counter 17, which records the ordinal number of the receiver from the output of which this signal has been sent. The receiver bearing this number will participate no more in the comparison procedure which is aimed at detecting the maximum value. After the detection of the maximum signal, a change occurs in the state of the counters 17 and 18, a signal from the second receiver of the line 14 appears at the output of the switching circuit 15, and the procedure aimed at detecting the maximum value will be repeated. The detected signal, which will be the second one in value, is fed, via the switch 21, to the difference input of the adder 22. The signal from the output of the adder 22 is fed, via a multiplier 23, to the input of the inverting adder 24, where it is added to a reference signal $U_1$, and is fed, via the inverter 25, to the input of a brightness detector 12. There are three brightness detectors 12 connected to the setting means 5, (FIG. 2) and signals $U_2$, $U_3$, and $U_4$ appear at the output of each of them respectively. These signals arrive at an input of the setting means 5 (FIG. 2). In this case, the setting means 5 is built around an adding inverter 26 (FIG. 4) having its output connected to the base of a transistor 27. The transistor 27 converts the error signal obtained at the output of the adding inverter 26 into the current of its emitter circuit in which the coil of the solenoid 4 is arranged. A current proportional to the error signal of the setting means 5 will thus flow through the coil of the solenoid 4.

Figure 5:
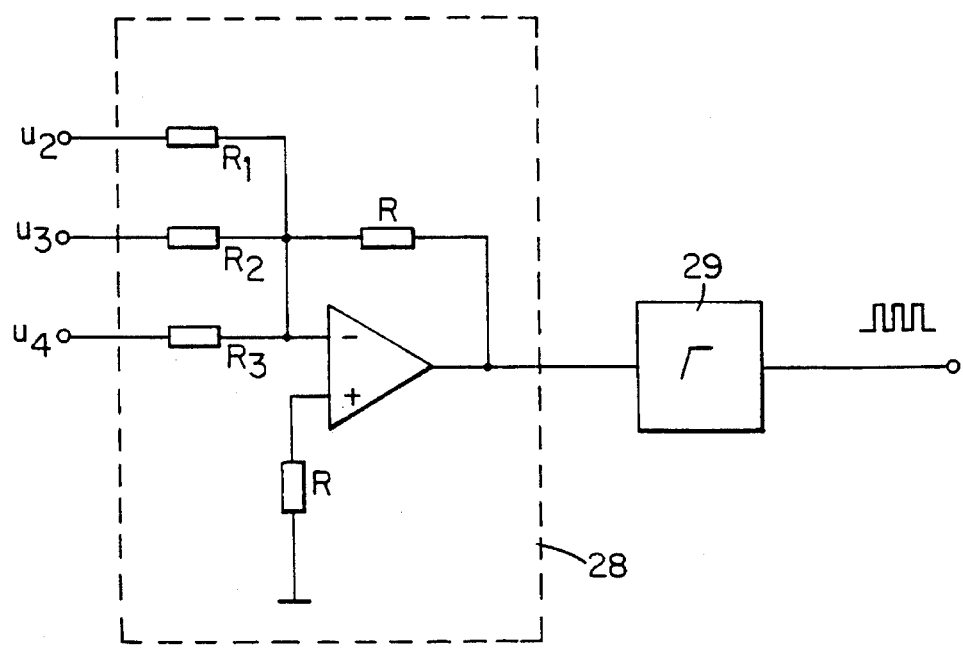
FIG. 5 is a circuit diagram of means for setting the speed of movement of a support.

The setting means 11 receives signals from the brightness detectors 12 at its input and functions in a similar manner. The setting means 11 consists of an inverting adder 28 (FIG. 5) having its output connected to a control input of a generator 29. The error signal from the inverting adder 28 is converted in this case at the output of generator 29 into a varying pulse rate signal which controls the speed of movement of the drives 10 (FIG. 1) and 13 (FIG. 2).

Figure 6:
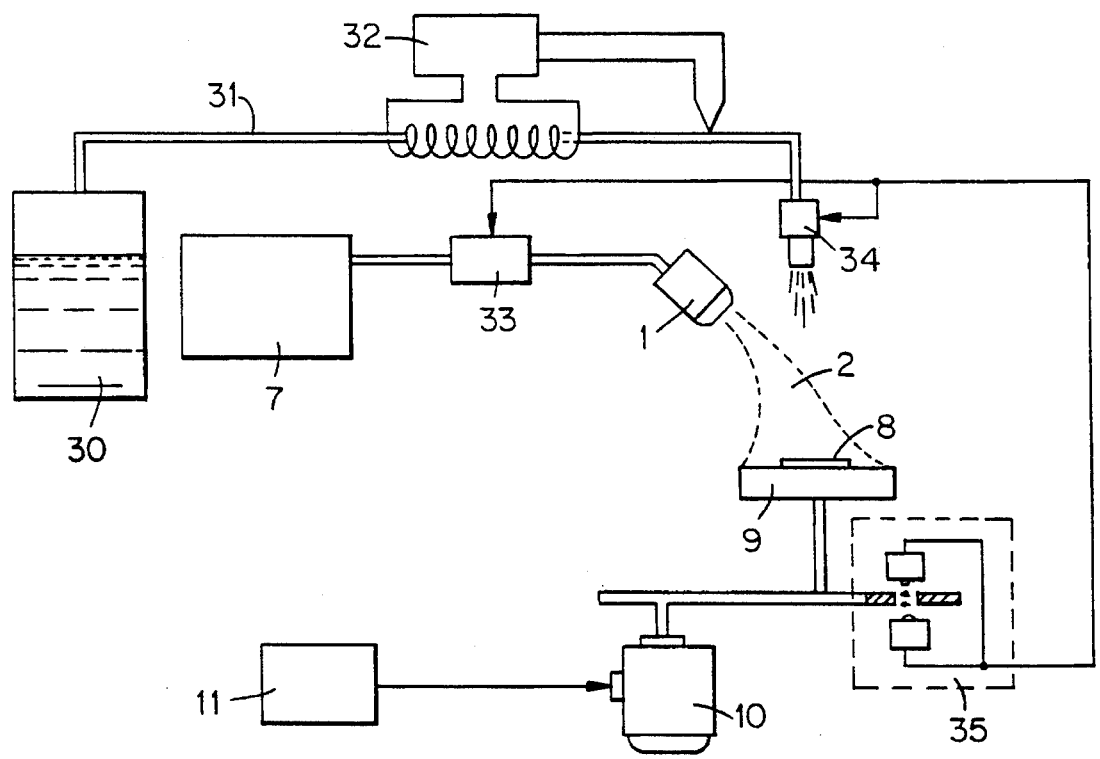
FIG. 6 is a schematic illustration of a plasma forming gas supply system having a controlled valve and a vaporizer.

The plasma forming gas supply system 7 in the apparatus of FIG. 2 does not allow coatings of organometal compounds to be deposited. To achieve this, the system 7 is provided with a vaporizer 30 (FIG. 6) having a thermo-controller conduit 31 and a heater 32. The heater 32 maintains a constant temperature in the conduit 31 in order to avoid condensation of vapors of organometal compounds which are fed into the plasma jet 2 to be desposited on support 8.

To reduce the consumption of gas and to combine operations such as the cleaning of support surfaces and the deposition of coatings, the system 7 is provided with valves 33 and 34 mounted on the conduit of the system 7 and on the conduit 31, respectively. Valves 33 and 34 are alternatively opened by a control signal received from a coordinate pickup 35, which is mounted, e.g., on the support holder 9. The pickup 35 may be in the form of an aperture of a length corresponding to the size of the surface of the support 8 being treated, a light source provided on the one side of the aperture, and a photo sensitive element provided on the opposite side of the aperture. A signal from the output of the photo sensitive element is a control signal for the valves 33 and 34. The valves 33 and 34 are opened only for the time of the arrival of the signal, so as to reduce gas consumption. The valve 33 is opened in response to even signals and the valve 34 is opened in response to odd signals, so as to ensure their consecutive operation. This operation of the apparatus allows its manufacturing capabilities to be enlarged and makes it more cost-effective.

Figure 7:
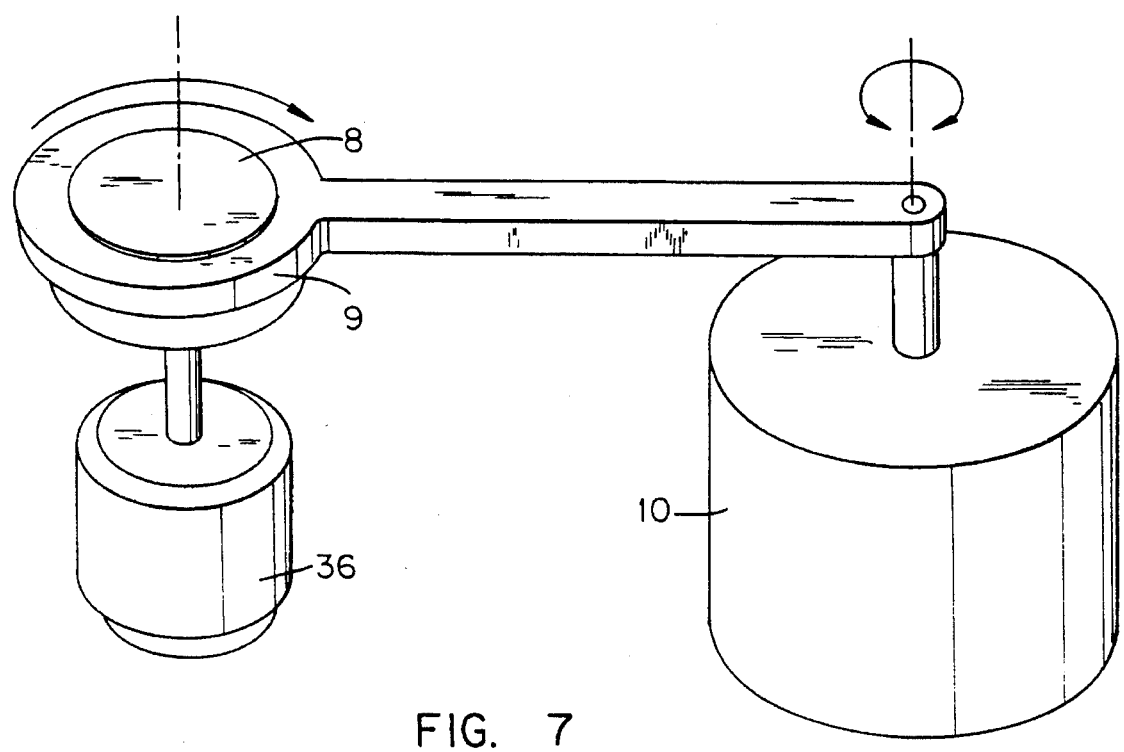
FIG. 7 is a perspective view of a support holder having an auxiliary drive.

If the size of the support 8 is greater than the size of plasma jet 2, it is preferred that the support holder 9 be provided with an auxiliary drive 36 (FIG. 7). The drive 36 rotates the support 8 about an axis drawn perpendicularly with respect to its plane through the geometrical centre of the support. This allows the treatment of the whole surface of support 8 to be carried in a single pass thus greatly increasing the throughput capacity of the apparatus.

The most preferred embodiments of the invention have been described above by way of example. It will be appreciated however that variations and modifications can be made within the scope of the appended claims. Thus, the circuitry of such units as the movement speed setter, the plasma jet size setter, and the brightness detector may vary. The design of the support holder may also be modified.

We claim:

1. Apparatus for use in the plasma treatment of a body, including a plasma jet generator, the plasma jet generator having means for generating a plasma jet at atmospheric pressure, a plasma forming gas supply system arranged to supply a plasma forming gas to the generator, and a support for a body to be treated with the plasma jet, being generated at atmospheric pressure, the plasma jet and the support for the body to be treated being mounted for successive relative movements with respect to one another in one direction in at least one coordinate axis in such a way that the support for the body and the plasma jet may be in or out of contact as required, means for controlling both the speed of relative movement between the support and the plasma jet and the cross-sectional size of the plasma jet which is generated at atmospheric pressure according to the relative values of the said speed and the said size in order to provide a required degree of treatment.

2. Apparatus as claimed in claim 1 including means for detecting the brightness of the plasma jet, the output of the means for detecting the brightness of the plasma jet being used to control the cross-sectional size of the plasma jet.

3. Apparatus as claimed in claim 2 in which the output of the means for detecting the brightness of the plasma jet is used to control the speed of the relative movement between the support and the plasma jet.

4. Apparatus as claimed in claim 1 wherein more than one support is included, and further including a turret for carrying more than one of said supports.

5. An apparatus as claimed in claim 1 in which the support for the body is rotatable about an axis drawn through the geometrical centre of the support and extends perpendicularly with respect to a plane of the support.

6. An apparatus as claimed in claim 1 wherein the plasma forming gas supply system includes a vapourizer, the vapourizer including a thermo-controlled conduit having a free end, the free end being directed towards the plasma jet so vapor flowing from the free end is incident on a portion of the plasma jet.

7. An apparatus as claimed in claim 1 in which the plasma forming gas supply system has at least one passage including a controlled valve, and a holder for the support has a coordinate pick up connected to supply a signal to the controlled valve, whereby the supply of the plasma forming gas may be controlled.

8. The apparatus of claim 1 further including means for controlling the cross-sectional area of the plasma Jet in response to an indication of the brightness of the plasma jet.

9. Apparatus as claimed in claim 1 including means for detecting the brightness of the plasma jet, and means responsive to the detecting means for controlling the cross-sectional area of the plasma jet.

10. Apparatus for use in the plasma treatment of a body, including a plasma jet generator, the plasma jet generator having means for generating a plasma jet at atmospheric pressure, a plasma forming gas supply system arranged to supply a plasma forming gas to the generator, and a support for a body to be treated with the plasma jet, the plasma jet being generated at atmospheric pressure, the plasma jet and the support for the body to be treated being mounted for relative movement with respect to one another in the direction of at least one coordinate axis in such a way that the support for the body and the plasma jet may be in or out of contact as required, means for controlling (1) the speed of relative movement between the support and the jet both in and out of contact with one another and (2) the cross-sectional size of the plasma jet which is generated at atmospheric pressure, the controlling means including means for detecting the brightness of the plasma jet, the output of the means for detecting the brightness of the plasma jet being used to control the cross-sectional size of the plasma jet.

11. Apparatus as claimed in claim 10 in which the output of the means for detecting the brightness of the plasma jet is used to control the speed of the relative movement between the support and the plasma jet.

12. Apparatus for use in the plasma treatment of a body comprising a plasma jet generator, a support for a body to be treated with the plasma jet, the plasma jet and the support for the body to be treated being mounted for relative movement with respect to one another in the direction of at least one coordinate axis in such a way that the support for the body and the plasma jet may be in or out of contact as required, means for controlling (1) the speed of relative movement between the support and the jet both in and out of contact with one another and (2) the cross-sectional size of the plasma jet, the controlling means controlling the cross-sectional area of the plasma jet in response to an indication of the plasma jet brightness.

13. The apparatus of claim 12 wherein the controlling means controls the relative speed of the support of the plasma jet.

14. The apparatus of claim 13 further including means for detecting the plasma jet brightness, the controlling means for the cross-sectional area and the relative speed being responsive to the detecting means.

15. The apparatus of claim 12 further including means for detecting the plasma jet brightness, the controlling means for the relative speed being responsive to the detecting means.

* * * * *